United States Patent
Okamoto et al.

(10) Patent No.: US 6,337,224 B1
(45) Date of Patent: *Jan. 8, 2002

(54) METHOD OF PRODUCING SILICON THIN-FILM PHOTOELECTRIC TRANSDUCER AND PLASMA CVD APPARATUS USED FOR THE METHOD

(75) Inventors: Yoshifumi Okamoto, Otsu; Masashi Yoshimi; Kenji Yamamoto, both of Kobe, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/554,164
(22) PCT Filed: Oct. 28, 1998
(86) PCT No.: PCT/JP98/04875
 § 371 Date: May 10, 2000
 § 102(e) Date: May 10, 2000
(87) PCT Pub. No.: WO99/25029
 PCT Pub. Date: May 20, 1999

(30) Foreign Application Priority Data

Nov. 10, 1997 (JP) .............................................. 9-307093
Mar. 9, 1998 (JP) ............................................. 10-056720
Apr. 22, 1998 (JP) ........................................... 10-112286
May 8, 1998 (JP) ............................................ 10-125902

(51) Int. Cl.[7] ........................ H01L 21/00; H01L 21/20; H01L 21/36
(52) U.S. Cl. ........................... 438/69; 438/96; 438/97; 438/488; 438/935; 438/763
(58) Field of Search ............................. 438/96, 97, 69, 438/988, 763, 935

(56) References Cited

U.S. PATENT DOCUMENTS

| | | | |
|---|---|---|---|
| 4,800,174 A | | 1/1989 | Ishihara et al. |
| 5,736,431 A | * | 4/1998 | Shinohara et al. ............ 439/96 |
| 5,913,986 A | * | 6/1999 | Matsuyama et al. ........ 136/255 |
| 5,956,572 A | * | 9/1999 | Kidoguchi et al. ............ 438/96 |
| 6,100,465 A | * | 8/2000 | Shinohara et al. ........ 136/258 |
| 6,168,968 B1 | * | 1/2001 | Umemoto et al. ............ 438/96 |
| 6,200,825 B1 | * | 3/2001 | Yoshimi et al. ............... 438/24 |

FOREIGN PATENT DOCUMENTS

| | | |
|---|---|---|
| JP | A62271418 | 11/1987 |
| JP | A254922 | 2/1990 |
| JP | A2231773 | 9/1990 |
| JP | A4137725 | 5/1992 |
| JP | A563221 | 3/1993 |
| JP | A567797 | 3/1993 |
| JP | A745540 | 2/1995 |
| JP | A9162431 | 6/1997 |
| JP | A1-9925029 | 5/1999 |

OTHER PUBLICATIONS

Meier et al., App. Phys. Lett., vol. 65, No. 7, pp. 862 (1994).

* cited by examiner

Primary Examiner—John F. Niebling
Assistant Examiner—Viktor Simkovic
(74) Attorney, Agent, or Firm—Birch, Stewart, Kolasch & Birch, LLP

(57) ABSTRACT

In a method of manufacturing a silicon-based thin film photoelectric converter, a crystalline photoelectric conversion layer included in the photoelectric converter is deposited by plasma CVD under the following conditions: the temperature of the underlying film is at most 550° C.; a gas introduced into a plasma reaction chamber has a silane-based gas and a hydrogen gas where the flow rate of the hydrogen gas relative to the silane-based gas is at least 50 times; the pressure in the plasma reaction chamber is set to 3 Torr; and the deposition speed is 17 nm/min in the thickness-wise direction.

20 Claims, 5 Drawing Sheets

METHOD OF PRODUCING SILICON THIN-FILM PHOTOELECTRIC TRANSDUCER AND PLASMA CVD APPARATUS USED FOR THE METHOD

This application is the national phase under 35 U.S.C. § 371 of PCT International Application No. PCT/JP98/04875 which has an International filing date of Oct. 28, 1998, which designated the United States of America.

Technical Field

The present invention relates to methods of manufacturing thin film photoelectric converters and plasma CVD apparatuses used for the methods, and more particularly, to reduction in the cost of silicon-based (silicon or silicon alloy) photoelectric converters and improvements in the performance thereof. Note that in this specification, the terms, "polycrystalline", "microcrystalline" and "crystalline" refer not only to complete crystalline states, but also to partially amorphous states.

Background Art

Typical thin film photoelectric converters include amorphous silicon-based solar cells. Since amorphous photoelectric conversion materials are formed by plasma CVD, normally at low temperatures around 200° C., the materials can be formed on inexpensive substrates such as glass, stainless steel, and organic films and this is why they are believed to be promising as materials for manufacturing low cost photoelectric converters. Furthermore, since in amorphous silicon, the absorption coefficient is large in the visible light region, short-circuit current of 15 mA/cm$^2$ or higher has been achieved in a solar cell using an amorphous photoelectric conversion layer having a film thickness of 500 nm or less.

The amorphous silicon-based materials, however, suffer from so-called Stebler-Wronskey effect, i.e. deterioration in the photoelectric conversion characteristic by long-term light irradiation, and the effective sensitivity wavelength region ranges up to about 800 nm. Therefore, in a photoelectric converter using an amorphous silicon-based material, the reliability and performance improvement is limited, and essential advantages of the material that it allows for flexibility in selecting a substrate or applicability in low cost process are not fully taken advantage of.

Meanwhile, in recent years, much energy has been devoted to development of photoelectric converters using a thin film including a crystalline silicon layer such as polycrystalline silicon and microcrystalline silicon. The development is an attempt to compatibly achieve reduction in the cost of a photoelectric converter and improvement in the performance by forming a high quality, crystalline silicon thin film on an inexpensive substrate in a low temperature process and its application to various photoelectric converters such as photo sensor in addition to solar cells is expected.

There are methods of forming such crystalline silicon thin films including directly depositing a film on a substrate by CVD or sputtering and depositing an amorphous film on a substrate in a similar process, followed by thermal anneal or laser anneal for crystallization. Any of these methods requests that the process must be carried out at a temperature of 550° C. or less in order to use an inexpensive substrate as described above.

Among such processes, it is expected that the method of directly depositing a crystalline silicon thin film by plasma CVD can most readily achieve reduction in the process temperature and increase in the area of the film, and that a high quality film can be relatively easily obtained. If a polycrystalline silicon thin film is obtained by this method, a high quality, crystalline silicon thin film is formed on a substrate by some process, and then, using the film as a seed layer or a crystallization control layer, a film may be formed thereon such that a high quality, polycrystalline silicon thin film can be formed at a relatively low temperature.

Meanwhile, there is a well known method of forming a film, using a silane-based material gas diluted 10 times or more with hydrogen, by setting the pressure in a plasma reaction chamber in the range from 10 mTorr to 1 Torr to obtain a microcrystalline silicon thin film. In this method, a silicon thin film can be readily formed into microcrystal at a temperature around 200° C. For example, a photoelectric converter including a photoelectric conversion unit formed by a pin junction of microcrystalline silicon is disclosed in Appl. Phys. Lett., Vol. 65, 1994, p. 860. The photoelectric conversion unit includes a p-type semiconductor layer, an i-type semiconductor layer which is a photoelectric conversion layer and an n-type semiconductor layer, simply deposited sequentially by plasma CVD, and all the semiconductor layers are of microcrystalline silicon. However, the deposition speed is less than 10 nm/min in the thickness-wise direction by conventional methods and under conventional conditions and too low for obtaining a high quality, crystalline silicon film and a high performance, silicon-based thin film photoelectric converter, and the speed is not more than the case of forming amorphous silicon films.

Meanwhile, an example of a silicon film formed at a relatively high pressure of 5 Torr by low temperature plasma CVD is disclosed by Japanese Patent Laying-Open No. 4-137725. In this example, however, the silicon thin film is directly deposited on a substrate of glass or the like and is presented simply as an example in comparison to the invention disclosed by Japanese Patent Laying-Open No. 4-137725, and the quality of the film is too low to be applied to photoelectric converters.

In general, if the pressure condition is raised in plasma CVD, a considerable amount of powdery product or dust is generated in the plasma reaction chamber, in which case such dust is likely to fly and come into the deposited film and generate pin holes in the film. In order to reduce such deterioration in the quality of the film, the reaction chamber must be frequently cleaned inside. Particularly when a film is formed at a low temperature of 550° C. or less and the pressure in the reaction chamber is raised, such disadvantages can be noticed. In the manufacture of a photoelectric converter such as a solar cell, a thin film having a large area must be deposited, which could lower the yield and increase the labor and cost for maintaining the film forming device.

Therefore, when a thin film photoelectric converter is manufactured by plasma CVD, conventional methods have employed a pressure condition of 1 Torr or less as described above.

A polycrystalline photoelectric converter including a crystalline silicon-based thin film photoelectric conversion layer as described above suffers from the following disadvantage. More specifically, when used as a photoelectric conversion layer for a solar cell, the film thickness must be at least several μm to several tens Ktm so that the film is allowed to absorb enough sunlight in view of the absorption coefficient of crystalline silicon, whether it is polycrystalline silicon or partly amorphous microcrystalline silicon. This thickness is larger than that of an amorphous silicon photoelectric conversion layer by about one or two digits.

Meanwhile, by conventional methods, the forming speed of a film is not more than that of an amorphous silicon film, as low as about 10 nm/min for example if various condition parameters including temperature, pressure in the reaction chamber, high frequency power and gas flow ratio are considered for obtaining a high quality, crystalline silicon-based thin film at a low temperature by plasma CVD. Stated differently, the crystalline silicon thin film photoelectric conversion layer requires time for forming several to several ten times as long as that of an amorphous silicon photoelectric conversion layer, which impedes the throughput in the manufacturing process of photoelectric converters from increasing and the cost from being reduced.

Conventional apparatuses to produce solar cells include those of the inline type according to which a plurality of film deposition chambers are linearly coupled as shown the block diagram in FIG. 6 and those of the multi-chamber type according to which a plurality of chambers are arranged around an intermediate chamber as shown in the block diagram in FIG. 7. Note that for an amorphous silicon solar cell, there is also known a simple method called "single chamber method", according to which all the semiconductor layers are formed in the same chamber. However, in order to prevent conductivity determining impurity atoms which are doped into p-type layers and n-type layers from coming into different kinds of semiconductor layers, the gas in the chamber must be completely replaced for example by gas replacement for 1 hour using a purge gas such as hydrogen before forming these semiconductor layers. Even such gas replacement process could not secure high performance of an amorphous silicon solar cell, the single chamber method is no longer used other than for experimental purposes. Furthermore, in the manufacture of an amorphous silicon solar cell, a layer of one conductivity type, a photoelectric conversion layer and a layer of the opposite conductivity type must be sequentially formed in a vacuum process without ever being exposed to the atmosphere in this method, and therefore the inline method or multi-chamber method is employed in industrial applications.

For example, in an nip type solar cell in which an n-layer, an i-layer and a p-layer are sequentially deposited from the side of the substrate, according to the inline method as shown in FIG. 6, an n-layer deposition chamber $3n$ to form the n-layer, 6 i-layer deposition chambers $3i_1$ to $3i_6$ to form a photoelectric conversion layer, and a p-layer deposition layer $3p$ to form the p-layer are continuously coupled. In this case, the n and p layers are thinner than the i-layer and require significantly shorter time to form than the i layer, a plurality of such i-layer deposition chambers are usually coupled to raise the productivity, and until the time for forming the n and p layers becomes the rate determining factor, the productivity improves as the number of i-layer deposition chambers increases. In this inline method, however, the plurality of i-layer deposition chambers thus provided require maintenance most, and therefore the entire production line must be stopped for maintenance of even a single i-layer deposition chamber.

Meanwhile, in the multi-chamber method shown in FIG. 7, a substrate on which films are to be deposited is moved through an intermediate chamber $4m$ to each of film deposition chambers $4n$, $4i_1$ to $4i_4$ and $4p$. Since a movable partition to keep airtightness is provided between each chamber and the intermediate chamber, a trouble caused in a certain chamber does not obstruct the use of the other chambers, and therefore the whole production line does not have to be stopped for the trouble. The producing apparatus according to this multi-chamber method however has a complicated an d therefore expensive mechanism to move the substrate while keeping airtight between intermediate chamber $4m$ and each of chambers $4n$, $4i_1$ to $4i_4$ and $4p$, and besides, the number of chambers which can be provided around intermediate chamber $4m$ is spatially limited, so the method is not much employed in practice.

If a silicon-based thin film photoelectric converter includes a photoelectric conversion unit including a pin or nip junction, a polycrystalline silicon-based thin film or a microcrystalline silicon-based thin film partially having an amorphous state would be preferably used for a conductivity type layer such as a p- or n-layer. When such a crystalline conductivity type layer is formed by plasma CVD, an electrode material layer such as a transparent conductive oxide film or metallic film serves as an underlying layer for a conductivity type layer to be deposited before a photoelectric conversion layer is deposited and the photoelectric conversion layer serves as an underlying layer for a conductivity type layer to be deposited after the photoelectric conversion layer is deposited,. The conductivity type layer would be preferably deposited under plasma CVD conditions to introduce high discharge power using a material gas diluted with hydrogen in order to improve the function of the layer. However, if a conductive type microcrystalline silicon-based film is deposited under active plasma conditions, high energy plasma damages the underlying layer or the mutual diffusion between the impurity atoms becomes active to deteriorate the interface characteristic of semiconductor junction, so that grains cannot grow enough in the conductivity type layers and an incomplete microcrystalline film may result. The speed of film deposition is extremely low by the conventional plasma CVD, which impedes the throughput in the manufacture of photoelectric converters from increasing and the cost from being reduced.

In view of the above described disadvantages associated with the conventional techniques, it is an object of the present invention to improve the throughput in the manufacturing process by increasing the forming speed of a crystalline silicon-based photoelectric conversion layer formed by low temperature plasma CVD, to improve the performance of a photoelectric converter and to provide a plasma CVD apparatus preferably used for these purposes.

DISCLOSURE OF THE INVENTION

In a method of manufacturing a silicon-based thin film photoelectric converter according to one embodiment of the present invention, the photoelectric converter includes one or more photoelectric conversion units formed on a substrate, at least one of the photoelectric conversion units is a polycrystalline photoelectric conversion unit including a semiconductor layer of one conductivity type, a crystalline silicon-based thin film photoelectric conversion layer, and a semiconductor layer of the opposite conductivity type, sequentially deposited upon one another, the crystalline photoelectric conversion layer is deposited under the plasma CVD conditions: the underlying layer is at a temperature of 550° C. or less; the gas introduced into a plasma reaction chamber has a silane-based gas and a hydrogen gas as main constituents; the flow rate of the hydrogen gas is 50 times or more that of the silane-based gas; the pressure in the plasma reaction chamber is set at 3 Torr or more; and the forming speed of the film is not less than 17 nm/min in the thicknesswise direction.

A method of manufacturing a silicon-based thin film photoelectric converter by plasma CVD according to another embodiment of the present invention is characterized in that an n-type layer is formed to have a thickness in the range from 2 to 50 nm, an i-type crystalline silicon-based photoelectric conversion layer is formed to have a thickness in the range from 1 to 5 μm at a deposition speed of 17 nm/min or more, a p-type layer is formed to have a thickness in the range from 2 to 50 nm, and these n-type layer, i-type photoelectric conversion layer, and p-type layer are successively formed in the same plasma CVD reaction chamber.

In a method of manufacturing a silicon-based thin film photoelectric converter according to another embodiment of the present invention, the photoelectric converter includes one or more photoelectric conversion units formed on a substrate, and at least one of the photoelectric conversion units is a polycrystalline photoelectric conversion unit including a semiconductor layer of one conductivity type, a crystalline silicon-based photoelectric conversion layer of substantially intrinsic semiconductor, and a semiconductor layer of the opposite conductivity type, sequentially layered upon one another by plasma CVD, at least one of the conductivity type layers includes a crystalline silicon-based thin film, and the crystalline conductivity type layer is deposited by plasma CVD under the following conditions: the underlying layer is at 550° C. or less; a material gas introduced into the plasma reaction chamber has a silane-based gas and a diluted gas containing hydrogen as main constituents and the flow rate of the diluted gas is 100 times or more that of the silane-based gas; the pressure in the plasma reaction chamber is set at 5 Torr or more; and a film is formed at a speed of 12 nm/min or more in the thickness-wise direction to have a thickness in the range from 2 to 50 nm.

BEST MODES FOR CARRYING OUT THE INVENTION

Figure 1:
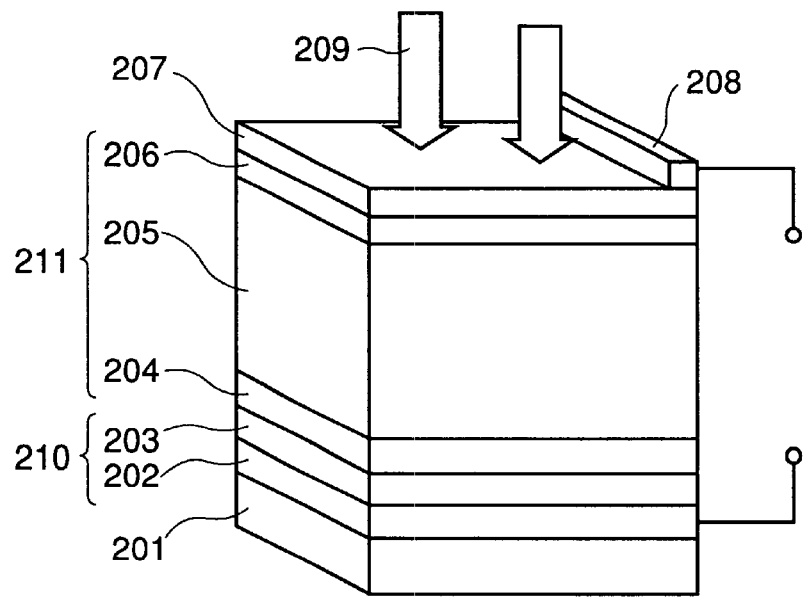
FIG. 1 is a schematic perspective view of a polycrystalline silicon-based thin film photoelectric converter according to a manufacturing method according to Embodiment 1 of the present invention.

FIG. 1 schematic perspective view of a silicon-based thin film photoelectric converter manufactured according to one embodiment of the present invention. A metal such as stainless steel, an organic film or inexpensive glass having a low melting point may be used for the substrate 201 of the converter.

A backside electrode 210 on substrate 201 includes at least one of the thin films (A) and (B) below and may be formed by vapor deposition or sputtering.

(A) A metallic thin film including a layer of at least one metal selected from Ti, Cr, Al, Ag, Au, Cu and Pt or an alloy thereof.

(B) A transparent conductive thin film including a layer of at least one oxide selected from ITO, $SnO_2$ and ZnO.

A semiconductor layer 204 of one conductivity type in photoelectric conversion unit 211 is deposited on backside electrode 210 by plasma CVD. An n-type silicon layer doped with at least 0.01 atomic % phosphorus which determines the conductivity type, a p-type silicon layer doped with at least 0.01 atomic % boron atoms or the like may be used for one conductivity type semiconductor layer 204. These conditions for one conductivity type semiconductor layer 204 are however not limitative, and such impurity atoms may be aluminum or the like, or an alloy material such as silicon carbide and silicon germanium may be used for the p-type silicon layer. One conductivity type silicon-based thin film 204 may be polycrystalline, microcrystalline or amorphous, and the thickness is set in the range from 1 to 100 nm, more preferably in the range from 2 to 30 nm.

For photoelectric conversion layer 205 of the crystalline silicon-based thin film, a non-doped i-type polycrystalline silicon thin film, an i-type microcrystalline silicon thin film having a crystallized volume fraction of at least 80% or a weak $p^-$- or $n^-$-type silicon-based thin film material containing a small amount of impurity and enough photoelectric conversion efficiency may be used. The material of photoelectric conversion layer 205 is not limited to the above, and an alloy material such as silicon carbide or silicon germanium may be used. Photoelectric conversion layer 205 has a thickness in the range from 0.5 to 201 μm, which is necessary and sufficient for a crystalline silicon thin film photoelectric conversion layer.

Crystalline silicon-based photoelectric conversion layer 205 may be formed by a commonly employed parallel plate-type RF plasma CVD as well as by plasma CVD using a high frequency power supply voltage having a frequency of at most 150 MHz and in the range from the RF band to VHF band.

Note that by these kinds of plasma CVD, crystalline silicon-based photoelectric conversion layer 205 is formed at a temperature of 550° or less, the temperature which allows the above described inexpensive substrate to be used.

Crystallized silicon-based thin film photoelectric conversion layer 205 is deposited under a pressure of 3 Torr or more in a reaction chamber, preferably 5 Torr or more by plasma CVD. At this time, the high frequency power density is preferably not less than 20 $mW/cm^2$, more preferably not less than 50 $mW/cm^2$. Furthermore, the gas introduced into the reaction chamber contains as main constituents a silane-based gas and a hydrogen gas, and the flow rate of the hydrogen gas is 50 times or more that of the silane-based gas. Mono-silane, di-silane or the like is preferable as the silane-based gas, and a halogenated silicon gas such as silicon tetrafluoride, silicon tetrachloride, and dichlorsilane may be used as well. In addition to these, an inert gas such as noble gas, preferably helium, neon, argon or the like may be used.

The present invention is characterized in that crystalline silicon-based thin film photoelectric conversion layer 205 as described above may be formed at a speed of 17 nm/min or more.

Most crystal grains contained in crystalline silicon-based thin film photoelectric conversion layer 205 grows extending upward in a columnar form from underlying layer 204. Much of the grains have a (110) preferential crystal orientation plane parallel to the surface of the film, and its intensity ratio of the (111) diffraction peak to the (220) diffraction peak obtained by X-ray diffraction is preferably at most 1/5, more preferably at most 1/10. If the surface of the underlying layer, one conductivity type layer 204 is substantially flat, a surface texture structure having fine irregularities of intervals smaller by about one digit than the film thickness can be automatically formed on the surface after photoelectric conversion layer 205 is formed.

The resulting crystalline silicon-based thin film 205 preferably contains hydrogen in the range from 0.5 atomic % to 30 atomic %, more preferably in the range from 1 atomic % to 20 atomic % obtained by secondary ion mass spectroscopy.

In the method of forming crystalline silicon-based thin film photoelectric conversion layer 205 according to the present invention, the pressure is higher than the conventional condition such as 3 Torr or less, and therefore ion damages in the film can be reduced as much as possible. Therefore, if the high frequency power or the gas flow rate is increased to increase the deposition speed, a high quality film can be formed at a high speed with small ion damages on the deposited film surface. If the film is formed under high pressure, there could be contamination by powder generated in the reaction chamber, but such problem is less likely since the material gas is diluted with a large amount of highly thermally conductive gas.

Furthermore, crystalline silicon-based thin film 205 of higher quality than the conventional method is obtained according to the present invention for the following reasons. Since the film is formed at a high speed, the ratio of impurity atoms such as oxygen and nitrogen remaining in the reaction chamber to be introduced into the film is reduced. Since the time required for crystal nucleations is short in the initial stage of the film growth, the crystal nucleation density is relatively reduced, which allows crystal grains strongly oriented in large size to be easily formed. Furthermore, if the film is formed at a high pressure, grain boundaries or defects in grains may be easily passivated and the defect density is reduced.

On photoelectric conversion layer 205, a silicon-based thin film as semiconductor layer 206 of the conductivity type opposite to that of the underlying layer 204 is deposited by plasma CVD. As this opposite conductivity type, silicon-based thin film 206, a p-type silicon thin film doped with 0.01 atomic % or more of boron, conductivity type determining atoms, for example or an n-type silicon thin film doped with 0.01 atomic % or more of phosphorus may be used. The conditions for semiconductor layer 206 of the opposite conductivity are not limitative, and the impurity may be aluminum in the p-type silicon, for example, or a film of an alloy material such as silicon carbide or silicon germanium may be used. Silicon-based thin film 206 of the opposite conductivity type may be polycrystalline, microcrystalline or amorphous, and the thickness is set in the range from 3 to 100 nm, more preferably in the range from 5 to 50 nm.

A transparent conductive oxide film of at least one layer selected from ITO, $SnO_2$, ZnO and the like is formed on photoelectric conversion unit 211, on which a comb-shaped, metal electrode 208 including a layer of a metal selected from Al, Ag, Au, Cu, Pt and the like or an alloy thereof is formed as a grid electrode by sputtering or vapor deposition, and the photoelectric converter as shown in FIG. 1 is completed.

Figure 2:
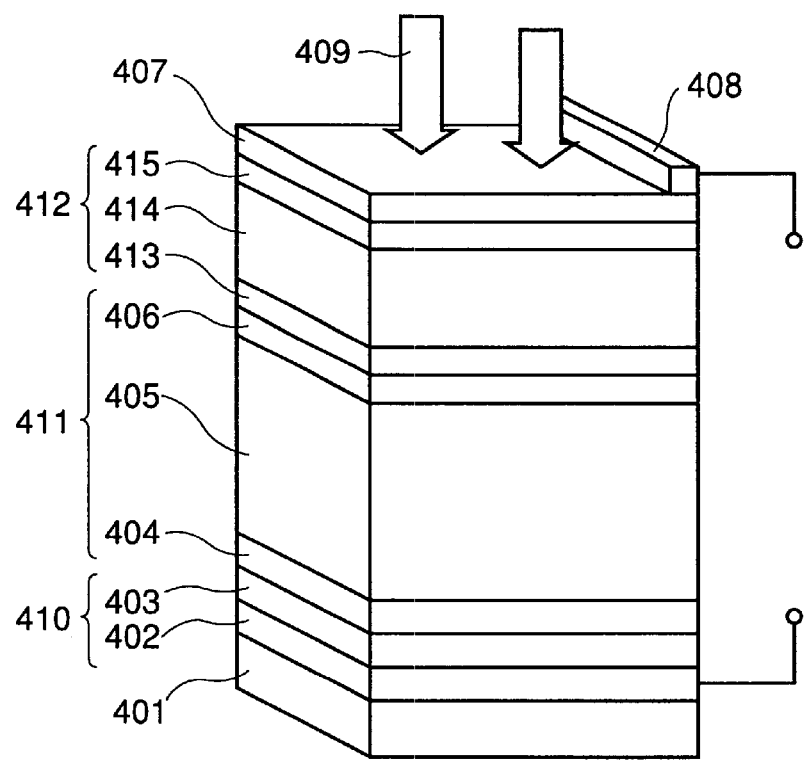
FIG. 2 is a schematic perspective view of an amorphous/polycrystalline tandem type silicon-based thin film photoelectric converter according to a manufacturing method according to another embodiment of the present invention.

FIG. 2 is a schematic perspective view of a tandem-type silicon-based thin film photoelectric converter manufactured according to another embodiment of the present invention. In the tandem-type photoelectric converter shown in FIG. 2, a plurality of layers 402 to 406 on substrate 401 are formed the same manner corresponding to the plurality of layers 202 to 206 similarly to the case in FIG. 1.

In the tandem-type photoelectric converter shown in FIG. 2, however, an amorphous photoelectric conversion unit 412 is formed on a polycrystalline photoelectric conversion unit 411 by plasma CVD. Amorphous photoelectric conversion unit 412 includes a microcrystalline or amorphous silicon-based thin film 413 of one conductivity type, an amorphous silicon-based thin film photoelectric conversion layer 414 which is a substantially intrinsic semiconductor, and a microcrystalline or amorphous silicon-based thin film 415 of the opposite conductivity type, sequentially layered on one another on polycrystalline photoelectric conversion unit 411.

A front side transparent electrode 407 and a comb-shaped metallic electrode 408 are formed on amorphous photoelectric conversion unit 412 similarly to corresponding elements 207 and 208 in FIG. 1, and thus the tandem-type photoelectric converter in FIG. 2 is completed.

Figure 3:
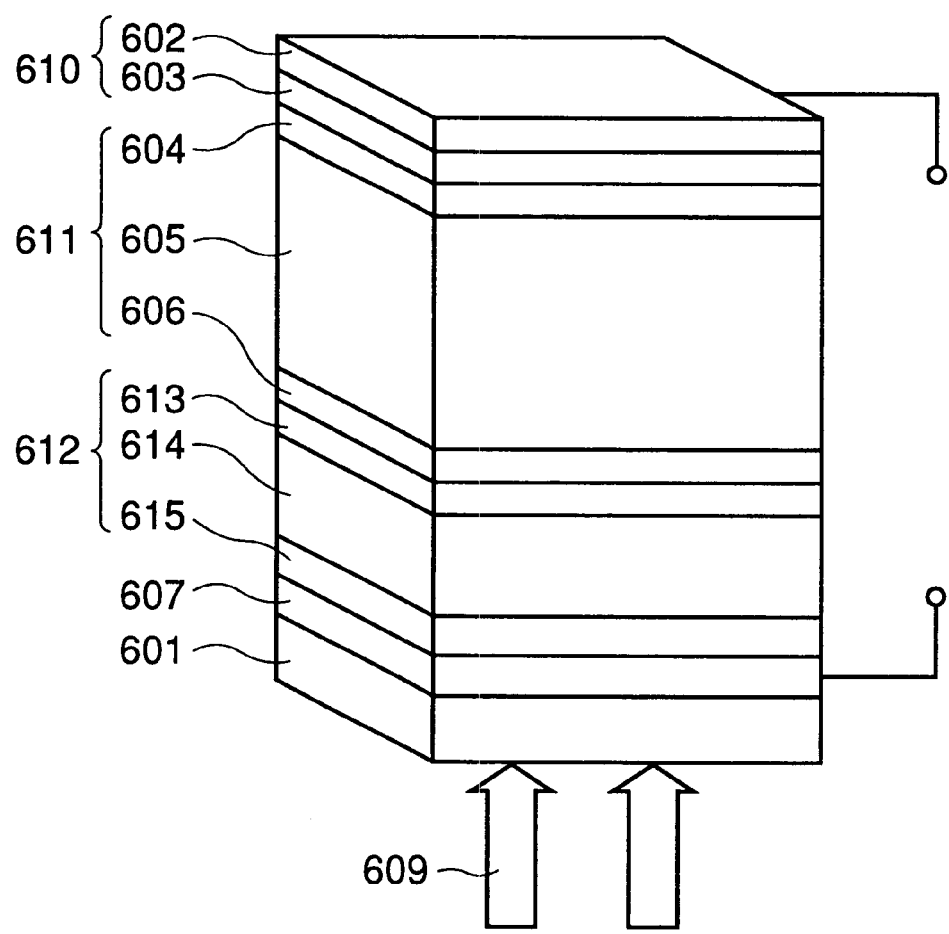
FIG. 3 is a schematic perspective view of an amorphous/polycrystalline tandem type silicon-based thin film photoelectric converter according to a manufacturing method according to another embodiment of the present invention.

As another embodiment of the present invention, a tandem type silicon-based thin film photoelectric converter in which light comes into the side of a glass substrate as shown in FIG. 3 may be manufactured. In this photoelectric converter shown in FIG. 3, a layer 607 corresponding transparent layer 407 in FIG. 2 is formed on a transparent substrate 601. On this transparent conductive layer 607, a plurality of layers 602 to 606 and 613 to 615 corresponding to the plurality of layers 402 to 406 and 413 to 415 in FIG. 2 are sequentially deposited in the opposite order. At this time, layers 602 to 606 and 613 to 615 in FIG. 3 may be formed similarly to corresponding layers 402 to 407 and 413 to 415 in FIG. 2.

It goes without saying that the largest problem in increasing the throughput lies in the step of manufacturing crystalline photoelectric conversion layers (205, 405, 605), which must have a large thickness, in the series of manufacturing steps of the above described photoelectric converter. However, according to the present invention, the deposition speed of the crystalline photoelectric conversion layer significantly increases, and a film of even better quality can be obtained, which may greatly contribute to improvement in the performance of the silicon-based thin film photoelectric converter and reduction in the cost.

In the following, silicon-based thin film solar cells as silicon-based thin film photoelectric converters according to various embodiments of the present invention will be described with reference to solar cells according to Comparison Examples.

Embodiment 1

A polycrystalline silicon thin film solar cell was manufactured as Embodiment 1 corresponding to the embodiment shown in FIG. 1. A Ag film 202 having a thickness of 300 nm and a ZnO film 203 having a thickness of 100 nm thereon were formed as a backside electrode 210 on a glass substrate 201 by sputtering. An n-type microcrystalline silicon layer 204 doped with phosphorus and having a thickness of 30 nm, a non-doped, polycrystalline silicon thin film photoelectric conversion layer 205 having a thickness of 3 $\mu$m and a p-type microcrystalline silicon layer 206 doped with boron and having a thickness of 15nm were formed on backside electrode 210 by RF plasma CVD to form an nip photoelectric conversion unit 211. On photoelectric conversion unit 211, a transparent, conductive ITO film as thick as 80 nm was deposited as a front side electrode 207 by sputtering, on which a comb-shaped, Ag electrode 208 to take current was deposited by vapor deposition.

Polycrystalline silicon thin film photoelectric conversion layer 205 was deposited by RF plasma CVD using a high frequency power supply of 13.56 MHz. In the reaction gas used at this time contained a mixture of silane and hydrogen in the flow ratio of 1:60, and the pressure in the reaction chamber was 3.0 Torr. The discharge power density was 80 mW/cm$^2$, and the temperature to form the film was set at 400° C. Under these conditions, the forming speed of polycrystalline silicon thin film photoelectric conversion layer 205 was 17 nm/min. The intensity ratio of the (111) diffraction peak relative to the (220) diffraction peak obtained by X-ray diffraction for photoelectric conversion layer 205 was 1/16, and the content of hydrogen obtained by secondary ion mass spectroscopy was 0.8 atomic %.

In the output characteristic, when incident light 209 of AM1.5 with 100 mW/cm$^2$ was directed to this polycrystalline silicon thin film solar cell of Embodiment 1, the open-circuit voltage was 0.498V, the short-circuit voltage density was 27.0 mA/cm$^2$, the fill factor was 71.5%, and the conversion efficiency was 9.6%.

Embodiment 2

In Embodiment 2, a polycrystalline silicon thin film solar cell similar to Embodiment 1 was manufactured. More specifically, in this Embodiment 2, the film forming conditions of layers and the construction of the device were the same as those of Embodiment 1, except that the film forming conditions of polycrystalline silicon thin film photoelectric conversion layer 205 was different.

Polycrystalline silicon thin film photoelectric conversion layer 205 according to Embodiment 2 was deposited by RF plasma CVD using a high frequency power supply of 13.56 MHz. The reaction gas included silane and hydrogen in the flow ratio of 1:120, and the pressure in the reaction chamber was 5.0 Torr. The discharge power density was 120 mW/cm$^2$, and the film forming temperature was set at 400° C. Under the film forming conditions, the deposition speed of polycrystalline silicon thin film 205 was 23 nm/min. The intensity ratio of the (111) diffraction peak relative to the (220) diffraction peak obtained by X-ray diffraction for photoelectric conversion layer 205 was 1/30, and the hydrogen content obtained by secondary ion mass spectroscopy was 1.6 atomic %.

In the output characteristics, when incident light 209 of AM1.5 with 100 mMW/cm$^2$ was directed to the polycrystalline silicon thin film solar cell of Embodiment 2, the open-circuit voltage was 0.520 V, the short-circuit current density was 27.4 mA/cm$^2$, and the fill factor was 75.1%, and the conversion efficiency was 10.5%.

Embodiments 3 to 8

As Embodiments 3 to 8, a polycrystalline silicon thin film solar cell 205 was manufactured on a glass substrate similarly to Embodiments 1 and 2 except that the conditions of forming polycrystalline silicon thin film photoelectric conversion layer 205 were changed to those in the following Table 1. The physical properties of polycrystalline silicon thin film photoelectric conversion layers 205 formed according to Embodiments 3 to 8 and characteristics of solar cells manufactured including each layer are given in Table 2. In Tables 1 and 2, the conditions of forming the films according to Embodiments 1 and 2, the physical properties of films formed under the conditions and characteristics of solar cells manufactured including the films are also given.

TABLE 1

| Embodiment No. | Discharge Freq. (MHz) | Gas Flow Ratio Silane/H$_2$ | Pressure (Torr) | Discharge Power (mW/cm$^2$) | Temp. (° C.) | Deposition Speed (nm/min) |
|---|---|---|---|---|---|---|
| 1 | 13.56 | 1/60 | 3.0 | 80 | 400 | 16 |
| 2 | 13.56 | 1/100 | 4.0 | 100 | 400 | 18 |
| 3 | 13.56 | 1/120 | 5.0 | 120 | 400 | 23 |
| 4 | 80 | 1/120 | 5.0 | 150 | 400 | 55 |
| 5 | 13.56 | 1/100 | 5.0 | 160 | 400 | 42 |
| 6 | 13.56 | 1/120 | 5.5 | 160 | 400 | 45 |
| 7 | 13.56 | 1/160 | 10.0 | 220 | 400 | 65 |
| 8 | 13.56 | 1/140 | 5.0 | 120 | 300 | 20 |

TABLE 2

| Embodiment No. | X-ray Diffraction (111)/(220) | H Content in Film (atom. %) | Open-circuit Voltage (V) | Short-circuit Current Density (mA/cm$^2$) | Fill Factor (%) | Conversion Efficiency (%) |
|---|---|---|---|---|---|---|
| 1 | 1/16 | 0.8 | 0.498 | 27.0 | 71.5 | 9.6 |
| 2 | 1/16 | 1.0 | 0.502 | 27.0 | 74.1 | 10.0 |
| 3 | 1/30 | 1.6 | 0.520 | 27.4 | 75.1 | 10.7 |
| 4 | 1/27 | 2.0 | 0.528 | 27.2 | 72.7 | 10.4 |
| 5 | 1/22 | 2.0 | 0.516 | 27.7 | 70.3 | 10.0 |
| 6 | 1/22 | 2.0 | 0.523 | 27.1 | 70.0 | 9.9 |
| 7 | 1/20 | 2.3 | 0.524 | 26.7 | 70.2 | 9.8 |
| 8 | 1/30 | 3.2 | 0.545 | 26.2 | 74.4 | 10.6 |

COMPARISON EXAMPLES 1 TO 4

As Comparison Examples 1 to 4, polycrystalline silicon thin film solar cells were manufactured on glass substrates similarly to Embodiments 1 to 8 except that polycrystalline silicon thin film photoelectric conversion layers were formed under the conditions in the following Table 3. The physical properties of the polycrystalline silicon thin films formed in the Comparison Examples 1 to 4 and characteristics of solar cells including the films are given in Table 4.

TABLE 3

| Comparison Example No. | Discharge Freq. (MHz) | Gas Flow Ratio Silane/H$_2$ | Pressure (Torr) | Discharge Power (mW/cm$^2$) | Temp. (° C.) | Deposition Speed (nm/min) |
| --- | --- | --- | --- | --- | --- | --- |
| 1 | 13.56 | 1/18 | 1.0 | 15 | 400 | 5 |
| 2 | 13.56 | 1/18 | 1.0 | 80 | 400 | 19 |
| 3 | 13.56 | 1/18 | 5.0 | 80 | 400 | 18 |
| 4 | 13.56 | 1/60 | 1.0 | 80 | 400 | 4 |

TABLE 4

| Comparison Example No. | X-ray Diffraction (111)/(220) | H Content in Film (atom. %) | Open-circuit Voltage (V) | Short-circuit Current Density (mA/cm$^2$) | Fill Factor (%) | Conversion Efficiency (%) |
| --- | --- | --- | --- | --- | --- | --- |
| 1 | 1/9 | 0.4 | 0.461 | 26.8 | 70.5 | 8.7 |
| 2 | 1/3 | 0.3 | 0.188 | 22.4 | 52.1 | 2.2 |
| 3 | 2/5 | 0.4 | 0.302 | 14.8 | 36.2 | 1.6 |
| 4 | 1/4 | 0.2 | 0.102 | 17.7 | 44.3 | 0.8 |

As can be seen from Tables 3 and 4, in Comparison Example 1, the deposition speed is low since the photoelectric conversion layer is formed under the conventional conditions, and the solar cell including the photoelectric conversion layer has a conversion efficiency lower than those of Embodiments 1 to 8. In Comparison Example 2, the deposition speed of the photoelectric conversion layer increases since the discharge power is increased, but the conversion efficiency of the solar cell including the photoelectric conversion layer is significantly small. In Comparison Example 3, since both the reaction chamber pressure and discharge power are increased, the forming speed of the photoelectric conversion layer increases, while the photoelectric conversion efficiency of the solar cell including the photoelectric conversion layer is smaller with the flow ratio of silane and hydrogen being the same. In Comparison Example 4, the gas flow ratio of silane relative to hydrogen is significantly reduced while the discharge power is increased with the pressure being the same as the conventional method, and therefore, the deposition speed of the photoelectric conversion layer is reduced and the conversion efficiency of the solar cell including the photoelectric conversion layer is further reduced.

Embodiment 9

A method of manufacturing a polycrystalline silicon thin film solar cell including the step of forming a crystalline silicon-based thin film photoelectric conversion layer 205 at a low temperature and a high speed according to Embodiments 1 to 8 is also useful in manufacturing a tandem-type solar cell having an amorphous silicon-based photoelectric conversion unit further on since the manufacturing process is almost similar. According to Embodiment 9 corresponding to the embodiment shown in FIG. 2, in a tandem-type solar cell having an amorphous photoelectric conversion unit 412 including an amorphous silicon photoelectric conversion layer 414 of a non-doped layer as thick as 0.3 μm on a polycrystalline silicon thin film photoelectric conversion unit 411, the open-circuit voltage of 1.40V, the short-circuit current density of 13.4 mA/cm$^2$ and the conversion efficiency of 14.0% were obtained under the same illumination conditions as Embodiment 1.

According to another embodiment of the present invention, at the time of depositing a crystalline silicon-based thin film photoelectric conversion layer 205 in FIG. 1, for example, a distance between an electrode at which a substrate is preferably provided in the plasma CVD reaction chamber and an electrode opposite to the substrate is preferably set to be not more than 1 cm, and the pressure in the reaction chamber is preferably set to be not less than 5 Torr. The distance between the electrodes is set thus small, in order to maintain the plasma discharge in a normal state, even if the gas pressure is increased to a level higher than 5 Torr. The high frequency power density at this time is preferably at least 100 mW/cm$^2$. The flow ratio of the silane-based gas introduced into the reaction chamber relative to the hydrogen gas is preferably 50 times or more, more preferably 100 times or more. Under the forming conditions of crystalline silicon-based photoelectric conversion layer 205, the deposition speed may be surely 1 μm/hr or higher.

Figure 4:
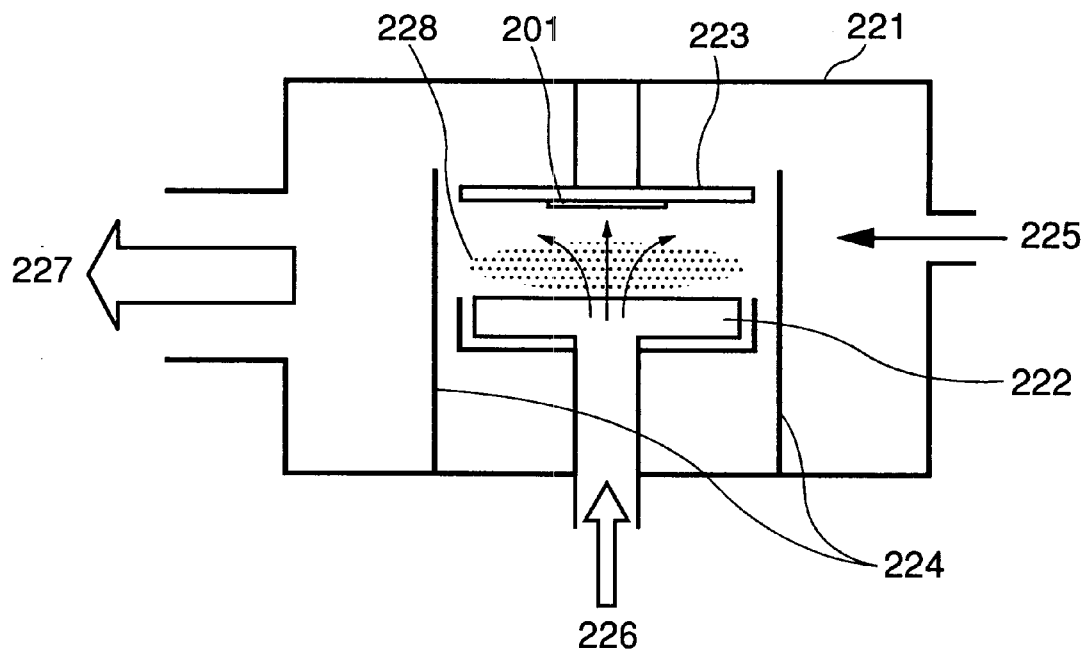
FIG. 4 is a schematic cross sectional view of a plasma CVD apparatus preferably used according to the methods according to the embodiments of the present invention.
Figure 5:
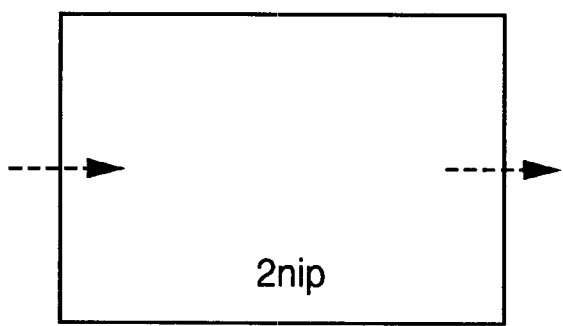
FIG. 5 is a schematic block diagram of a single-chamber type plasma CVD apparatus used in an example of the manufacturing methods according to the embodiments of the present invention.
Figure 6:
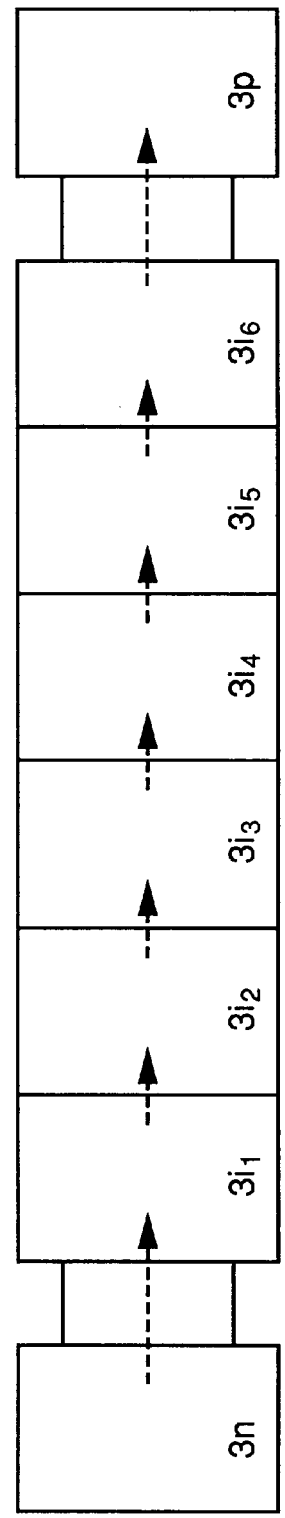
FIG. 6 is a schematic block diagram of a inline type manufacturing apparatus used for a conventional method of manufacturing a photoelectric converter.
Figure 7:
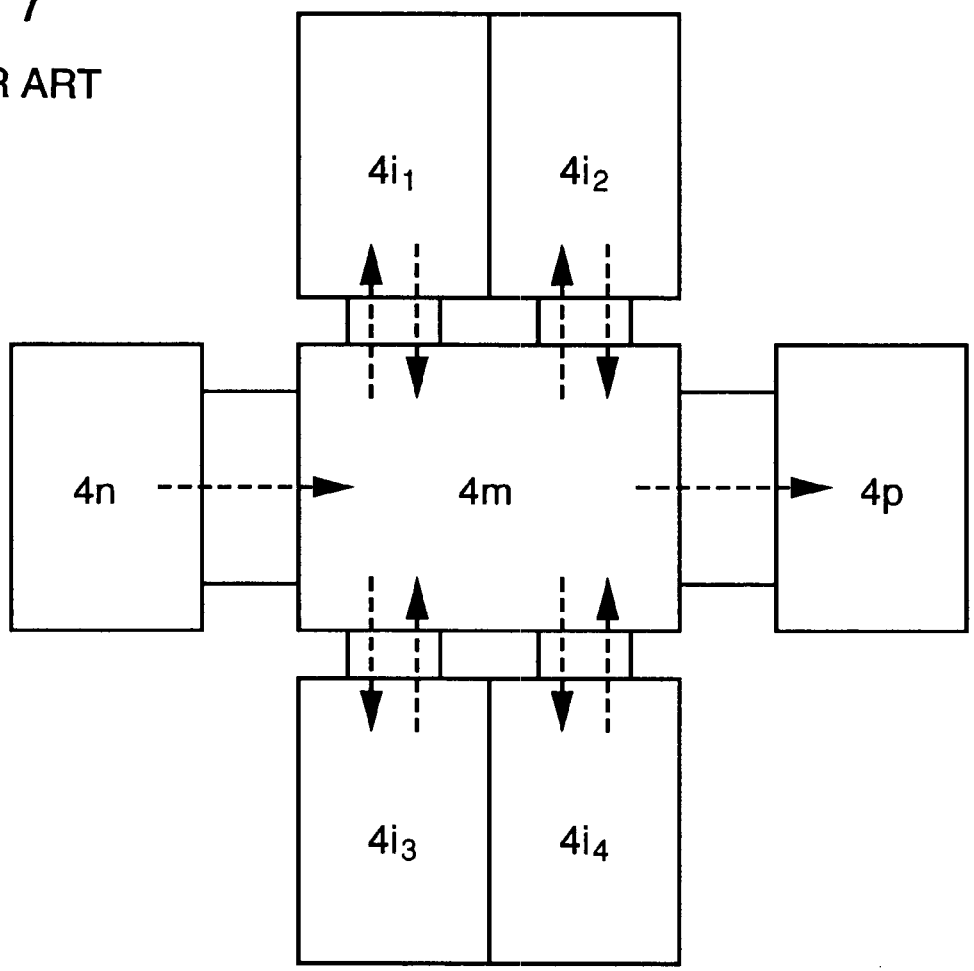
FIG. 7 is a schematic block diagram of a multi-chamber type manufacturing apparatus used for a conventional photoelectric converter.

FIG. 4 is a schematic cross section of an example of a plasma CVD apparatus preferably used for forming polycrystalline silicon-based thin film photoelectric conversion layer 205 in the above-described manner. In this plasma CVD apparatus, a lower plasma discharge electrode 222 and an upper electrode 223 are provided in a reaction chamber 221. At least one of these two electrodes 222 and 223 opposite to each other in the vertical direction is movable in the vertical, horizontal and/or diagonal directions and the distance therebetween can be decreased/increased to be less/more than 1 cm.

A substrate 201 is introduced into reaction chamber 221 through an inlet/outlet 225 including a valve (not shown) and can be attached on electrode 223. At this time, the distance between both electrodes 222 and 223 is expanded to be at least 1 cm so that the substrate can be easily attached to electrode 223. Lower electrode 222 is hollow to introduce a reaction gas 226 thereinto, and a plurality of small gas inlets are provided on the upper surface. When substrate 201 is mounted on upper electrode 223, the distance between both electrodes 222 and 223 is reduced to 1cm or less. Reaction chamber 221 is evacuated through an exhaustion flow path 227 while a reaction gas is supplied from the gas inlets on lower electrode 222, so that the chamber may be maintained at a prescribed pressure.

Meanwhile, when a photoelectric conversion layer 205 is deposited, silicon powdery matter could be generated from the unconsumed reaction gas for the growth of photoelectric conversion layer 205. In the conventional methods, since the distance between the electrodes is large, the speed of forming the film is low and the pressure of the reaction gas is low, the influence of such silicon powdery matter is small. However, as shown in FIG. 4, when plasma CVD is performed under a reaction gas pressure of at least 5 Torr and with the distance between electrodes 222 and 223 being at most 1cm, plasma 228 is generated in a limited, narrow region, and therefore, much silicon powdery matter could result, in which case more frequent maintenance of the CVD apparatus than the conventional cases is required to remove the silicon powdery matter.

In order to reduce such silicon powdery matter and allow photoelectric conversion layer 205 to more efficiently grow, the plasma CVD apparatus shown in FIG. 4 preferably includes a gas flow path control plate 224. Flow path control plate 224 is preferably a tube having a circular or polygonal cross section to surround the circumference of both electrodes 222 and 223. This tubular flow path control plate 224 extends in the direction substantially orthogonal to electrodes 222 and 223, and has both ends extending beyond the positions of both electrodes 222 and 223. Flow path control plate 224 however may include an opening to watch for discharge plasma 228 or let in/out substrate 201 as long as the function of the plate is not impeded. Alternatively, flow path control plate 224 may be formed by providing a plurality of plates in a tubular form rather than an integral tube as a whole. Furthermore, flow path control plate 224 may be movable such that substrate 201 can be transferred without disturbance.

Gas flow path control plate 224 functions to concentrate the flow of the reaction gas in the vicinity of substrate 201 to allow photoelectric conversion layer 205 to grow efficiently and also functions to reduce the generation of silicon powdery matter. Flow path control plate 224 is preferably kept at a temperature in the range from plus and minus 100° C. from the temperature of the substrate to further reduce the generation of silicon powdery matter. This is for the purpose of preventing the silicon powdery matter from being generated from the unconsumed part of the reaction gas flow concentrated in the vicinity of substrate 201 for growing photoelectric conversion layer 205, so that the powdery matter precipitates in the form of a silicon film on flow path control plate 224. If the temperature of flow path control plate 224 is too high, the substrate temperature rises with the temperature of plasma accordingly, which makes it difficult to maintain substrate 201 at a prescribed temperature. Meanwhile, if the temperature of flow path control plate 224 is too low, the reaction gas which has reached to flow path control plate 224 will precipitate as silicon powdery matter rather than as a silicon film.

Gas flow path control plate 224 is preferably positioned apart from the circumference of electrodes 222 and 223 at a distance in the range from 1 to 50 cm. This is because if the distance between both electrodes 222 and 223 is too small, discharge could occur between these electrodes 222 and 223 and flow path control plate 224, and if it is large, the effect of the gas flow path control is reduced.

Note that the above semiconductor layers 204, 205 and 206 are preferably formed in separate plasma reaction chambers, but they may be formed in a single reaction chamber 221 as shown in FIG. 4. In that case, the atmosphere gas in reaction chamber 221 must be fully replaced before forming each of semiconductor layers 204, 205 and 206. Since conductivity type layers 204 and 206 are much thinner than photoelectric conversion layer 205, they are desirably allowed to grow at a relatively low reaction gas pressure and a low speed, and the distance between both electrodes 222 and 223 is expanded to 1cm or more in order to keep stable discharge at the low gas pressure.

In the following, a silicon-based thin film solar cell manufactured according to a method which employs an electrode distance of 1 cm or less will be described as an embodiment of the present invention with reference to solar cells according to comparison examples.

COMPARISON EXAMPLES 5 to 8

Polycrystalline silicon thin film solar cells as Comparison Examples 5 to 8 were manufactured similarly to the solar cell shown in FIG. 1. A Ag film 202 as thick as 300 nm and a ZnO film 203 as thick as 100 nm thereon were formed on a glass substrate 201 as a backside electrode 210 by sputtering. On backside electrode 210 formed were phosphorus-doped, n-type microcrystalline silicon layer 204 as thick as 30 nm, a non-doped, polycrystalline silicon thin film photoelectric conversion layer 205 as thick as 3 µm, and a boron-doped, p-type microcrystalline silicon layer 206 as thick as 15 nm each by plasma CVD, thus forming an nip photoelectric conversion unit 211. On photoelectric conversion unit 211, as front side electrode 207, a transparent conductive ITO film as thick as 80 nm was deposited by sputtering, on which a comb-shaped Ag electrode 208 for taking current was deposited by vapor deposition.

N-type microcrystalline silicon layer 204 was deposited by RF plasma CVD. The flow ratio of the reaction gas used at that time was 5 sccm for silane, 200 sccm for hydrogen, and 0.05 sccm for phosphine, and the reaction pressure was 1 Torr. The RF power density was 150 mW/cm$^2$, and the temperature for forming the film was set to 200° C. The dark conductivity of an n-type microcrystalline silicon film as thick as 300 nm, directly deposited on a glass substrate under the same conditions as these plasma CVD conditions was 10 S/cm.

A crystalline silicon photoelectric conversion layer 205 was formed on n-type microcrystalline silicon layer 204 under the plasma CVD conditions in Table 5. The distance between the plasma discharge electrodes at the time of forming photoelectric conversion layer 205 was 2 cm in Comparison Examples 5, 6 and 8, while it was 1.5 cm in Comparison Example 7. Note that the reaction gas was supplied not through the plurality of gas inlets provided on the surface of the electrodes as shown in FIG. 4 at this time, but supplied transversely between a pair of discharge electrodes similarly to the conventional methods. The output characteristics, when incident light 209 of AM1.5 with 100 mW/cm$^2$ was directed to the solar cells thus formed in Comparison Examples 5 to 8, are given in Table 6 together with the film quality of photoelectric conversion layer 205.

TABLE 5

| Comparison Example No. | Discharge Freq. (MHz) | Gas Flow Ratio Silane/$H_2$ | Pressure (Torr) | Discharge Power (mW/cm$^2$) | Temp. (° C.) | Deposition Speed ($\mu$m/hr) |
| --- | --- | --- | --- | --- | --- | --- |
| 5 | 13.56 | 1/18 | 1.0 | 15 | 400 | 0.3 |
| 6 | 13.56 | 1/18 | 1.0 | 80 | 400 | 1.1 |
| 7 | 13.56 | 1/18 | 5.0 | 80 | 400 | 1.1 |
| 8 | 13.56 | 1/60 | 1.0 | 80 | 400 | 0.2 |

TABLE 6

| Comparison Example No. | X-ray Diffraction (111)/(220) | H Content in Film (atom. %) | Open-circuit Voltage (V) | Short-circuit Current Density (mA/cm$^2$) | Fill Factor (%) | Conversion Efficiency (%) |
| --- | --- | --- | --- | --- | --- | --- |
| 5 | 1/9 | 0.4 | 0.461 | 26.8 | 70.5 | 8.7 |
| 6 | 1/3 | 0.3 | 0.188 | 22.4 | 52.1 | 2.2 |
| 7 | 2/5 | 0.4 | 0.302 | 14.8 | 36.2 | 1.6 |
| 8 | 1/4 | 0.2 | 0.102 | 17.7 | 44.3 | 0.8 |

As can be seen from Tables 5 and 6, in Comparison Example 5 in which an example of conventional typical manufacturing conditions are employed, a conversion efficiency higher than the other Comparison Examples is obtained, while the deposition speed of photoelectric conversion layer 205 is low. In Comparison Example 6, the discharge power density is higher than Comparison Example 5 which increases the deposition speed, but the photoelectric conversion efficiency is significantly lowered. In Comparison Example 7, the reaction gas pressure is higher than that of Comparison Example 6, and the deposition speed is not further improved, while the photoelectric conversion efficiency is further lowered. In Comparison Example 8, the flow ratio of hydrogen relative to silane is higher than Comparison Example 6, which in turn lowers the deposition speed significantly and further lowers the photoelectric conversion efficiency.

COMPARISON EXAMPLE 9

In Comparison Example 9, a photoelectric conversion layer 205 was attempted to be formed under the same conditions as those of Comparison Example 5 except that the distance between plasma discharge electrodes is shortened from 2 cm to 1 cm, but there was no discharge generated between the electrodes. In general, the gas pressure and the distance between the electrodes to keep discharge are in inverse relation, and if the gas pressure is small, the distance between the electrodes must be set relatively large, while if the gas pressure is large the distance between the electrodes must be set small.

COMPARISON EXAMPLE 10

In Comparison Example 10, a photoelectric conversion layer 205 was attempted to be formed under the same conditions as that of Comparison Example 6 except that the distance between the electrodes was reduced to 1 cm, but there was no discharge generated between the electrodes.

COMPARISON EXAMPLE 11

In Comparison Example 11, a photoelectric conversion layer 205 was attempted to be formed under the same conditions as Comparison Example 8 except that the distant between the electrodes was reduced to 1 cm, but there was no discharge generated between the electrodes.

Embodiments 9 to 13

Solar cells according to Embodiments 9 to 13 were manufactured similarly to Comparison Examples 5 to 8 except that an electrode 222 having a plurality of small gas inlets as shown in FIG. 4 was used when a photoelectric conversion layer 205 was formed, that the distance between the electrodes was set to 1 cm, and that photoelectric conversion layer 205 was formed under the conditions given in Table 7. Note that the gas inlets on the upper surface of lower electrode 222 used at this time were distributed in a density of 2 inlets/cm$^2$, and each of the inlets was circular and had a diameter of 0.5 mm. The distance between the electrodes was set to 1.0 cm when the reaction gas pressure was 5 Torr and to 0.7 cm when the pressure was 10 Torr. The output characteristics, when incident light 209 of AM1.5 with 100 mW/cm$^2$ was directed to the solar cells of Embodiments 9 to 13, are given in Table 8 together with the film quality of photoelectric conversion layer 205. As can be seen from Table 7, in Embodiments 9 to 13, high deposition speeds were obtained for photoelectric conversion layer 205, while as can be seen from Table 8, high photoelectric conversion efficiencies are obtained in the completed solar cells.

TABLE 7

| Embodiment No. | Discharge Freq. (MHz) | Gas Flow Ratio Silane/$H_2$ | Pressure (Torr) | Discharge Power (mW/cm$^2$) | Temp. (° C.) | Deposition Speed ($\mu$m/hr) |
| --- | --- | --- | --- | --- | --- | --- |
| 9 | 13.56 | 1/120 | 5.0 | 120 | 400 | 1.4 |
| 10 | 80 | 1/120 | 5.0 | 150 | 400 | 3.3 |
| 11 | 13.56 | 1/100 | 5.0 | 160 | 400 | 2.5 |

TABLE 7-continued

| Embodiment No. | Discharge Freq. (MHz) | Gas Flow Ratio Silane/H$_2$ | Pressure (Torr) | Discharge Power (mW/cm$^2$) | Temp. (° C.) | Deposition Speed (μm/hr) |
|---|---|---|---|---|---|---|
| 12 | 13.56 | 1/160 | 10.0 | 220 | 400 | 3.9 |
| 13 | 13.56 | 1/140 | 5.0 | 120 | 300 | 1.2 |

TABLE 8

| Embodiment No. | X-ray Diffraction (111)/(220) | H Content in Film (atom. %) | Open-circuit Voltage (V) | Short-circuit Current Density (mA/cm$^2$) | Fill Factor (%) | Conversion Efficiency (%) |
|---|---|---|---|---|---|---|
| 9 | 1/30 | 1.6 | 0.520 | 27.4 | 75.1 | 10.7 |
| 10 | 1/27 | 2.0 | 0.528 | 27.2 | 72.7 | 10.4 |
| 11 | 1/22 | 2.0 | 0.516 | 27.7 | 70.3 | 10.0 |
| 12 | 1/20 | 2.3 | 0.524 | 26.7 | 70.2 | 9.8 |
| 13 | 1/30 | 3.2 | 0.545 | 26.2 | 74.4 | 10.6 |

In Comparison Examples 12 to 16, a photoelectric conversion layer 205 was attempted to be formed under the same conditions as Embodiments 9 to 13 except that the distance between the electrodes was expanded from 1 cm to 2 cm, but there was no discharge generated between the electrodes.

Embodiment 14

In the above Embodiment 12, when the deposition speed of photoelectric conversion layer 205 formed using a glass substrate 201 having one side as large as 125 mm was measured, there was a maximum of 10% difference among various locations on the substrate. Therefore, in Embodiment 14, a gas flow path control plate 224 as shown in FIG. 4 was used. Flow path control plate 224 has a tubular shape with a circular cross section. The reaction gas let out from gas inlets provided in the upper surface of lower electrode 222 drifts about between both electrodes 222 and 223 and then passed over and under flow path control plate 224 to be exhausted from exhaustion flow path 227. At this time, photoelectric conversion layer 205 was set at 300° C. Except the use of flow path control plate 224, photoelectric conversion layer 205 was formed under the same conditions as Embodiment 12, but the deposition speed was 4.2 μm/hr, higher than Embodiment 12, and the difference in the growth speed of photoelectric conversion layer 205 was 4% at most, in other words, evenness in the growth speed was improved.

COMPARISON EXAMPLE 17

In Comparison Example 17, a photoelectric conversion layer 205 was formed under the same conditions as Embodiment 13 except that the density of gas inlets included in the upper surface of lower electrode 222 was 1 inlet/cm$^2$. In Comparison Example 17, the reaction gas flow in the vicinity of the substrate was uneven, and spots were observed with the unaided eye on the surface of the photoelectric conversion 205 formed.

By a method of forming a solar cell according to another embodiment of the present invention, substrate 201 having a backside electrode 210 as shown in FIG. 1 is taken out from the backside electrode deposition chamber, then moved into a single common, film deposition chamber 2nip for forming n-,i- and p-type semiconductor layers, and an n-type semiconductor layer 204 included in photoelectric conversion unit 211 is deposited by plasma CVD. (It goes without saying that the n-, i- and p- type semiconductor layers may be layered in the opposite order to the above.) At this time, the substrate may be transferred between the electrode deposition chamber and the semiconductor deposition chamber in the air without any problem. N-type microcrystalline silicon-based thin film 204 was set to have a thickness in the range from 2 to 50 nm, more preferably in the range from 5 to 30 nm.

A crystalline silicon-based thin film is formed as a photoelectric conversion layer 205 on n-type semiconductor layer 204 in the same chamber 2nip by CVD with the temperature of the underlying layer being 400°0 C. or less. The thickness of photoelectric conversion layer 205 is set in the range from 1 to 5 μm, more preferably in the range from 1 to 4 μm, the thickness necessary and sufficient as a crystalline silicon-based thin film photoelectric conversion layer.

Since n-layer 204 has been deposited in the same chamber 2nip immediately before photoelectric conversion layer 205 is deposited, phosphorus atoms, for example, diffused from an unnecessary part of the film sticking to the chamber wall surface or the plasma discharge electrodes form the initially deposited part in photoelectric conversion layer 205 into n-type. Such diffusion normally adversely affects the photoelectric conversion characteristics, but since n-layer 204 has a very small thickness in the range from 2 to 50 nm, and the photoelectric conversion layer 205 is deposited at a high speed equal to or higher than 17 nm/min, the phosphorus content of photoelectric conversion layer 205 is lower than the conventional film forming conditions, and the phosphorous density continuously decreases as the thickness of photoelectric conversion layer 205 increases. Therefore, the phosphorus-diffused part of photoelectric conversion layer 205 will not adversely affect the photoelectric conversion characteristics and could even complement n-layer 204 depending upon the conditions. The initial layer to be of n-type in photoelectric conversion layer 205 is assumed to have a thickness of at most 100 nm, but in this embodiment since the photoelectric conversion layer has a sufficiently large thickness in the range from 1 to 5 μm, and therefore the photoelectric conversion characteristics will not deteriorate.

Note that there may be formed an extremely thin amorphous silicon or silicon oxide film layer (not shown) between n-layer 204 and photoelectric conversion layer 205 in order to enhance the crystal orientation of photoelectric conversion layer 205. The thickness of such an intervening layer is preferably in the range from 0.5 to 50 nm, more preferably in the range from 1 to 5 nm.

A p-type layer 206 is formed on photoelectric conversion layer 205 in the same chamber 2nip. The thickness of p-type layer 206 is preferably in the range from 2 to 50 nm, more preferably in the range from 2 to 10 nm. P-type layer 206 may be not only an amorphous thin film but also a microcrystalline, silicon-based or alloy-based thin film, or may be a plurality of different thin films layered upon one another.

Note that immediately before forming n-type layer 204 and i-type layer 205 after inserting a new substrate into plasma CVD chamber 2nip, a purge gas such as hydrogen gas may be made to flow for cleaning the chamber, but the time for such cleaning is preferably about 20 minutes at most so that the productivity will not be impaired.

A transparent conductive oxide layer 207 including at least one layer selected from ITO, $SnO_2$, ZnO and the like and a comb-shaped metallic electrode 208 including at least one selected from Al, Ag, Au, Cu, Pt, Cr, Ti and the like or an alloy thereof are formed on photoelectric conversion unit 211 by sputtering or vacuum vapor deposition, and thus the photoelectric converter shown in FIG. 1 is completed. Note that in FIG. 1 light enters from the upper part, but it may be allowed to come in from the lower side, and in that case, metallic electrode 208 does not have to be comb-shaped and may be formed to cover layer 206 of the opposite conductivity with transparent conductive film 207 being omitted.

In the following, a method of manufacturing a silicon-based thin film solar cell according to an embodiment using a single CVD chamber will be described together with a method of manufacturing a solar cell as a comparison example.

COMPARISON EXAMPLE 18

Similarly to the solar cell shown in FIG. 1, an amorphous silicon thin film solar cell was manufactured by a method according to Comparison Example 18. A Ag film 202 having a thickness of 300 nm as a backside electrode 210 and a ZnO film 203 having a thickness of 100 nm thereon were formed on a glass substrate 201 by sputtering. Thereafter, the substrate was transferred into a semiconductor layer forming chamber 2nip, a phosphorus-doped, n-type microcrystalline silicon layer 204 having a thickness of 10 nm, a non-doped, amorphous silicon photoelectric conversion layer 205 having a thickness of 300 nm and a boron-doped, p-type microcrystalline silicon layer 206 having a thickness of 8 nm were formed on backside electrode 210 by plasma CVD, and thus an nip-type photoelectric conversion unit 211 was formed. Meanwhile, before i-type layer 205 was formed, the gas in chamber 2nip was once evacuated in a vacuum, then replaced with a hydrogen gas at a flow rate of 100 sccm. Meanwhile, before p-type layer 206 was formed, the gas in chamber 2nip was simply evacuated in a vacuum once and not replaced with hydrogen. A transparent ITO film as thick as 80 nm was deposited as a front side electrode 207 on photoelectric conversion unit 211 by sputtering, and a comb-shaped, Ag electrode 208 used to take current was formed thereon by vacuum vapor deposition.

N-type microcrystalline silicon layer 204 was deposited by RF plasma CVD under the following conditions. More specifically, the flow rate of the reaction gas was 5 sccm for silane, 200 sccm for hydrogen, and 0.05 sccm for phosphine, and the pressure in the reaction chamber was set to 1 Torr. The RF power density was 150 mW/cm$^2$ and the film forming temperature was 200° C. The dark conductivity of this n-type microcrystalline silicon film as thick as 300 nm and directly deposited on a glass substrate under the same conditions was 10 S/cm. Furthermore, amorphous silicon photoelectric conversion layer 205 formed on this n-type microcrystalline silicon layer 204 was deposited by RF plasma CVD at a film forming temperature of 150° C. At this time, silane was used for the reaction gas, and the pressure in chamber 2nip was 0.3 Torr. The dark conductivity of an i-type amorphous silicon film as thick as 300 nm and directly deposited on a glass substrate under the same film forming conditions was $5 \times 10^{-10}$ S/cm. The deposition speed of this i-type amorphous silicon layer 205 was 0.36 µm/hr.

In the output characteristics, when incident light 209 of AM1.5 with 100 mW/cm$^2$ was directed to the amorphous type solar cell manufactured in this comparison example 18, the open-circuit voltage was 0.830V, the short-circuit current density was 16.3 mA/cm$^2$, the fill factor was 50.3%, and the conversion efficiency was 6.83%.

COMPARISON EXAMPLE 19

Similarly to the solar cell shown in FIG. 1, a polycrystalline type silicon thin film solar cell was manufactured by a manufacturing method according to Comparison Example 19. In chamber 2nip, an n-type microcrystalline silicon layer 204, a polycrystalline silicon photoelectric conversion layer 205, and a p-type microcrystalline silicon layer 206 were formed in this order by plasma CVD, and thus an nip junction was formed. N-type microcrystalline silicon layer 204 and p-type microcrystalline silicon layer 206 were formed similarly to those in Comparison Example 18. Meanwhile, polycrystalline silicon photoelectric conversion layer 205 was formed using silane and hydrogen as the reaction gas, the ratio of silane/hydrogen was 1/18and the pressure in chamber 2nip was set to 1.0 Torr. The RF power density was 15 mW/cm$^2$, and the film forming temperature was set to 400° C. The deposition speed of i-type layer 205 was 0.3 µm/hr.

In this Comparison Example 19, similarly to Comparison Example 18, before i-type layer 205 was formed, the gas in chamber 2nip was once evacuated in a vacuum and then replaced with a hydrogen gas at a flow rate of 100 sccm for 3 minutes. Before p-type layer 206 was formed, the gas in chamber 2nip was simply evacuated once and not replaced with hydrogen.

In polycrystalline silicon photoelectric conversion layer 205 formed according to Comparison Example 19, the hydrogen content obtained by secondary ion mass spectroscopy was 4 atomic %, and the intensity ratio of the (111) diffraction peak relative to the (220) diffraction peak in X-ray diffraction was 1/9.

In the output characteristics, when incident light 209 of AM1.5 with 100 mW/cm$^2$ was directed to a polycrystalline solar cell obtained by the manufacturing method in this Comparison Example 19 the open-circuit voltage 0.467V, the short-circuit current density was 26.5 mA/cm$^2$, the fill factor was 65.4%, and the conversion efficiency was 8.09%.

Embodiment 15

A polycrystalline silicon thin film solar cell was manufactured by a method according to Embodiment 15 corresponding to the solar cell in FIG. 1. In chamber 2nip, an n-type microcrystalline silicon layer 204, a polycrystalline silicon photoelectric conversion layer 205, and a p-type microcrystalline silicon layer 206 were formed in this order by plasma CVD, and thus an nip junction was formed. N-type microcrystalline silicon layer 204 and p-type microcrystalline silicon layer 206 were manufactured similarly to Comparison Example 18. However, polycrystalline silicon photoelectric conversion layer 205 was formed with silane and hydrogen as the reaction gas, the ratio of silane and hydrogen was set to 1/120, the pressure in chamber 2*nip* was set to 5.0 Torr. The RF power density was 120 mW/cm$^2$, and the film forming temperature was set to 400° C. The deposition speed of i-type layer 205 at this time was 1.4 µm/hr.

Note that similarly to Comparison Example 18, the gas in chamber 2*nip* was evacuated in a vacuum once and replaced with a hydrogen gas at a flow rate of 100 sccm for 3 minutes before i-type layer 205 was formed in Embodiment 15. The gas in chamber 2*nip* was simply evacuated once before p-type layer 206 was formed and not replaced with hydrogen.

Thereafter, front side electrodes 207 and 208 were manufactured similarly to Comparison Example 18.

In polycrystalline silicon photoelectric conversion layer 205 formed in Embodiment 15, the hydrogen content obtained by secondary ion mass spectroscopy was 4 atomic %, and the intensity ratio of the (111) diffraction peak relative to the (220) diffraction peak in X-ray diffraction was 1/9.

In the output characteristics, when incident light 209 of AM1.5 with 100 mW/cm$^2$ was directed to the solar cell manufactured by the method of Embodiment 15, the open-circuit voltage was 0.522V, the short-circuit current density was 26.9 mA/cm$^2$, the fill factor was 73.4%, and the conversion efficiency was 10.3%.

By a method of manufacturing a solar cell according to another embodiment of the present invention, a photoelectric conversion unit 211 including an nip or pin junction is deposited by plasma CVD on backside electrode 210 as shown in FIG. 1. At least one of the p-type and n-type layers of conductivity type layers 204 and 206 included in such photoelectric conversion layer 211 is formed as a conductivity type layer of a crystalline silicon-based thin film such as polycrystalline silicon or microcrystalline silicon having a crystallized volume fraction of 50% or more. The thickness of each of these conductivity type layers 204 and 206 is set preferably in the range from 2 to 50 nm.

Crystalline silicon-based conductivity type layers 204 and 206 are deposited by plasma CVD at a pressure of 5 Torr or more, preferably 10 Torr or more in the reaction chamber. The high frequency power density at this time is preferably not less than 50 mW/cm$^2$. The reaction gas introduced into the reaction chamber includes a silane-based gas, a doping gas containing conductivity-determining impurity atoms, and a diluted hydrogen gas as main constituents, and the flow ratio of the diluted gas to the silane-based gas is set 100 times or more. Under these conditions to form crystalline silicon-based conductivity type layers 204 and 206, the deposition speed is 12 nm/min or higher, more preferably 25 nm/min or higher.

If crystalline silicon-based conductivity type layers 204 and 206 are each made to grow to have a thickness of 100 nm or more under the above described deposition conditions, most grains included in these conductivity type layers grow extending upward in a columnar manner from the underlying layer. Most of these grains have a (110) preferential crystal orientation plane parallel to the surface of the film, and the intensity ratio of the (111) diffraction peak relative to the (220) diffraction peak in X-ray diffraction is 0.2 or less. In these crystalline silicon-based conductivity type layers, the hydrogen content obtained by secondary ion mass spectroscopy is in the range from 0.5 to 30 atomic %.

Herein, the physical value of a crystalline silicon-based conductivity type layer made to grow as thick as 100 nm or larger and having a state close to a bulk state is believed to have an absolute value somewhat different from those of thin crystalline silicon-based conductivity type layers 204 and 206 deposited under the same CVD conditions in an actual photoelectric converter. However, it is difficult to evaluate directly and accurately the physical value of thin crystalline silicon-based conductivity type layers 204 and 206 formed in an actual photoelectric converter, and if it were possible, a high level evaluation method would be required if possible, and therefore the physical value of a crystalline conductivity type layer having a small thickness, close to a bulk state as described above is used for relative evaluation. However, one can easily assume that there exists close relation in the physical values between crystalline silicon-based conductivity type layers having small and large thicknesses formed under the same plasma CVD conditions.

In the method of forming crystalline silicon-based conductivity type layers 204 and 206 according to the present invention, the pressure is higher than in the conventional cases where the pressure is less than 1 Torr, and therefore, ion damages in the film can be reduced as much as possible. As a result, if the discharge power or the gas flow rate is increased to raise the deposition speed, a high quality film may be formed at a high speed with reduced ion damages to the underlying material. Otherwise possible contamination by power generated in the reaction chamber by forming a film at a high pressure is less likely, because the material gas is diluted with a large amount of highly thermally conductive gas such as hydrogen.

For the following reasons, crystalline silicon-based conductivity type layers 204 and 206 having higher quality than the conventional methods can be obtained. Since the deposition speed is high, the percentage of impurity atoms such as oxygen and nitrogen remaining in the reaction chamber being introduced into the film is reduced. Since the time required for crystal nucleations in the initial stage of the film formation is short, which relatively reduces the nucleation density, so that strongly oriented, large crystal grains may be more easily formed. If the film is formed at a higher pressure, grain boundaries or defects in the grains can be more easily passivated by hydrogen, which reduces the density of such defects. By these effects, the activation ratio of conductivity-determining impurity atoms important for conductivity type layers 204 and 206 is improved, and the resistance of these conductivity type layers can be easily reduced.

Meanwhile, photoelectric conversion layer 205 of a crystalline silicon-based thin film may be also formed at an underlying temperature of 550° C. or lower by plasma CVD as previously mentioned in connection with the foregoing embodiments. The thickness of photoelectric conversion layer 205 is in the range from 0.5 to 20 µm, which is necessary and sufficient for the crystalline silicon-based thin film layer.

Crystalline silicon-based thin film photoelectric conversion layer 205 is preferably formed under the following conditions, similarly to the previously mentioned conductivity type layers 204 and 205. More specifically, as the plasma CVD conditions to deposit photoelectric conversion layer 205, the pressure in the reaction chamber is set to at least 5 Torr, preferably to at least 10 Torr. The high frequency power density is preferably at least 50 mW/cm$^2$, more preferably at least 100 mW/cm$^2$. In addition, the gas introduced into the reaction chamber includes a silane-based gas and a diluted gas containing hydrogen as main constituents, and the flow ratio of the diluted gas to the silane-based gas is 100 times or more. Under the conditions to form crystalline silicon-based thin film photoelectric conversion layer 205 as described above, the deposition speed is 12 nm/min or higher.

For the same reason applied to the case of conductivity type layers 204 and 205, crystalline silicon-based thin film photoelectric conversion layer 205 having a quality higher than the conventional methods is obtained in this embodiment since the deposition speed is high, the percentage of impurities such as oxygen and nitrogen remaining in the reaction chamber being introduced into the film is reduced. Since the time required for crystal nucleations in the initial stage of the film growth is short, which relatively reduces the nucleation density, so that strongly crystal-oriented, large grains may be more easily formed. If the film is formed at a high pressure, grain boundaries and defects in grains are easily passivated by hydrogen and the density of such defects is reduced.

As in the foregoing, conductivity type layers 204 and 206, and photoelectric conversion layer 205 included in photoelectric conversion unit 211 are all deposited by plasma CVD at the above-mentioned temperature, gas flow ratio, pressure and deposition speed, the characteristics and manufacturing throughput of the photoelectric conversion converter are further improved.

A transparent conductive oxide film 207 including at least one selected from ITO, $SnO_2$, ZnO and the like is formed on photoelectric conversion unit 211, and a comb-shaped, metallic electrode including a layer of at least one metal selected from Al, Ag, Au, Cu, Pt and the like or an alloy thereof is formed thereon as a grid electrode 208 by sputtering or vapor deposition, and thus the photoelectric converter as shown in FIG. 1 is completed.

In the following, a polycrystalline silicon-based thin film solar cell according to an embodiment in which at least one conductivity type layer is formed into crystalline will be described together with a solar cell of a comparison example.

Embodiment 16

As a backside electrode 210, a polycrystalline silicon-based thin film solar cell was manufactured as Embodiment 16 corresponding to FIG. 1. A metallic layer 202 including a Ti layer having a thickness of 50 nm and a Ag layer having a thickness of 300 nm thereon, and a ZnO film 203 having a thickness of 100 nm were formed sequentially by sputtering on a glass substrate 201. There were formed on backside electrode 210, a phosphorus-doped, n-type crystalline silicon layer 204 as thick as 20 nm, a non-doped, crystalline silicon layer 205 as thick as 3 μm, and a boron-doped, p-type crystalline silicon layer 206 were formed by RF plasma CVD, and thus an nip photoelectric conversion unit 211 was formed. A transparent conductive ITO film as thick as 80 nm was deposited as a front side electrode 207 on nip photoelectric conversion unit 211 by sputtering, and a comb-shaped, Ag electrode 208 to take current was deposited thereon by vapor deposition N-type layer 204, i-type layer 205, and p-type 206 included in photoelectric conversion unit 211 were deposited by RF plasma CVD using a high frequency power supply of 13.56 MHz. The reaction gas used for depositing these layers at this time was silane and hydrogen. However, n-type layer 204 was doped additionally using phosphine as a doping gas, and p-type layer 206 additionally using diborane.

Table 9 gives various plasma CVD deposition conditions for forming n-type layer 204, i-type layer 205, and p-type layer 206. As characteristics of each of crystalline semiconductor layers 204, 205 and 206, Table 9 also gives the ratio of the (111) diffraction peak relative to the (220) diffraction peak in X-ray diffraction and the hydrogen content obtained by secondary ion mass spectroscopy for these layers.

TABLE 9

| Layer | Gas Flow Ratio Silane/$H_2$ | Temp. (° C.) | Pressure (Torr) | Discharge Power (mW/$cm^2$) | Film Thickness (nm) | Deposition Speed (nm/min) | X-ray Diffraction (111)/(220) | H Content in Film (atom. %) |
|---|---|---|---|---|---|---|---|---|
| n | 1/120 | 300 | 5.0 | 120 | 20 | 15 | 0.14 | 2.0 |
| i | 1/120 | 300 | 5.0 | 120 | 3000 | 15 | 0.16 | 2.3 |
| p | 1/140 | 150 | 5.0 | 180 | 10 | 12 | 0.19 | 6.0 |

In the output characteristics, when incident light 209 of AM1.5 with 100 mW/$cm^2$ was directed to the silicon thin film solar cell of Embodiment 16, the open-circuit voltage was 0.484V, the short-circuit current density was 26.2 mA/$cm^2$, the fill factor was 73.3% and the conversion efficiency was 9.3%.

Embodiment 17

In Embodiment 17, a silicon solar cell similar to Embodiment 16 was manufactured. As shown in Table 10 similar to Table 9, the solar cell according to Embodiment 17 is different from the solar cell according to Embodiment 16 in that crystalline n-type layer 204, crystalline i-type layer 205 and crystalline p-layer 206 are deposited under different plasma CVD conditions. As can be seen from comparison between Table 10 and Table 9, in the solar cell of Embodiment 17, the dilution ratio of hydrogen relative to silane, the reaction gas pressure, discharge power and deposition speed are increased.

TABLE 10

| Layer | Gas Flow Ratio Silane/$H_2$ | Temp. (° C.) | Pressure (Torr) | Discharge Power (mW/$cm^2$) | Film Thickness (nm) | Deposition Speed (nm/min) | X-ray Diffraction (111)/(220) | H Content in Film (atom. %) |
|---|---|---|---|---|---|---|---|---|
| n | 1/180 | 300 | 10.0 | 250 | 20 | 32 | 0.09 | 2.6 |
| i | 1/180 | 300 | 10.0 | 250 | 3000 | 34 | 0.07 | 2.7 |
| p | 1/250 | 150 | 10.0 | 300 | 10 | 26 | 0.12 | 7.4 |

In the output characteristics, when incident light 209 of AM1.5 with 100 mW/$cm^2$ was directed to a polycrystalline silicon thin film solar cell of Example 17, the open-circuit voltage was 0.516V, the short-circuit current density was 26.9 mA/cm², the fill factor was 77.1%, and the conversion efficiency was 10.7%.

Embodiment 18

In Embodiment 18, a silicon thin film solar cell similar to Embodiment 17 was manufactured. More specifically, as given in Table 11 similar to Table 10, Embodiment 18 is different from Embodiment 17 in that the plasma CVD conditions of crystalline n-layer 204, crystalline i-layer 205, and crystalline p-layer 206 included in photoelectric conversion unit 211 are different. As can be seen from comparison between Tables 10 and 11, in Embodiment 18, the dilution ratio of hydrogen relative to silane and the discharge power are further increased as compared to Embodiment 17.

TABLE 11

| Layer | Gas Flow Ratio Silane/H$_2$ | Temp. (° C.) | Pressure (Torr) | Discharge Power (mW/cm²) | Film Thickness (nm) | Deposition Speed (nm/min) | X-ray Diffraction (111)/(220) |
|---|---|---|---|---|---|---|---|
| n | 1/200 | 200 | 10.0 | 450 | 20 | 33 | 0.11 |
| i | 1/200 | 200 | 10.0 | 450 | 3000 | 34 | 0.09 |
| p | 1/300 | 100 | 10.0 | 650 | 10 | 30 | 0.13 |

In the output characteristics, when incident light 209 of AM1.5 with 100 mW/cm² was directed to the silicon thin film solar cell of Embodiment 18, the open-circuit voltage was 0.529V, the short-circuit current density was 26.4 mA/cm², the fill factor was 76.0%, and the conversion efficiency was 10.6%.

Embodiments 19 to 22

In Embodiments 19 to 22, silicon thin film solar cells similar to Embodiment 17 were manufactured. More specifically, Embodiments 19 to 22 are different from Embodiment 17 only in that the plasma CVD conditions of crystalline p-type layer 206 were changed in various ways. Table 12 gives various plasma CVD conditions according to Embodiments 19 to 22 and physical values of p-type layer 206 formed under those conditions together with the conditions and physical values according to Embodiment 17.

Embodiments 17, 19 to 22 including p-type layer 206 formed under the conditions given in Table 12, open-circuit voltage Voc, short-circuit current density Jsc, fill factor F.F., and conversion efficiency Effi. given in Table 13 were obtained.

TABLE 13

|  | Voc (volts) | Jsc (mA/cm²) | F.F. (%) | Effi.(%) |
|---|---|---|---|---|
| Embodiment 17 | 0.516 | 26.9 | 77.1 | 10.7 |
| Embodiment 19 | 0.489 | 26.5 | 74.9 | 9.7 |
| Embodiment 20 | 0.535 | 26.0 | 76.4 | 10.6 |
| Embodiment 21 | 0.522 | 26.2 | 75.0 | 10.3 |
| Embodiment 22 | 0.519 | 27.0 | 74.9 | 10.5 |

COMPARISON EXAMPLES 20 TO 22

In Comparison Examples 20 to 22, silicon solar cells similar to Embodiment 17 were manufactured. More specifically, Comparison Examples 20 to 22 are different from Embodiment 17 only in that the plasma CVD conditions of n-type layer 204 and p-type layer 206 are changed in various ways, as given in Table 14 similar to Table 10. As can be seen from comparison between Table 10 and Table 14, the hydrogen dilution ratio, reaction gas pressure, discharge power and deposition speed are significantly reduced in Comparison Example 20. In Comparison Example 21, the hydrogen dilution ratio is not changed, but the reaction gas pressure, discharge power and deposition speed are reduced. In Comparison Example 22, the reaction gas pressure is not

TABLE 12

| Embodiment No. | Gas Flow Ratio Silane/H$_2$ | Temp. (° C.) | Pressure (Torr) | Discharge Power (mW/cm²) | Film Thickness (nm) | Deposition Speed (nm/min) | X-ray Diffraction (111)/(220) | H Content in Film (atom. %) |
|---|---|---|---|---|---|---|---|---|
| 17 | 1/250 | 150 | 10.0 | 300 | 10 | 26 | 0.12 | 7.4 |
| 19 | 1/100 | 150 | 5.0 | 200 | 10 | 15 | 0.20 | 8.4 |
| 20 | 1/300 | 200 | 10.0 | 650 | 10 | 30 | 0.07 | 4.9 |
| 21 | 1/500 | 150 | 20.0 | 900 | 10 | 52 | 0.10 | 8.5 |
| 22 | 1/500 | 150 | 20.0 | 900 | 5 | 52 | 0.10 | 8.5 |

In the output characteristics, when incident light 209 of AM1.5 with 100 mW/cm² was directed to solar cells of changed, while the hydrogen dilution ratio and discharge power are reduced.

TABLE 14

|  |  | Gas Flow Ratio Silane/$H_2$ | Temp. (° C.) | Pressure (Torr) | Discharge Power (mW/cm$^2$) | Film Thickness (nm) | Deposition Speed (nm/min) | X-ray Diffraction (111)/(222) |
|---|---|---|---|---|---|---|---|---|
| Comparison Example 20 | n-layer | 1/60 | 300 | 1.0 | 15 | 20 | 1.2 | 0.15 |
|  | p-layer | 1/60 | 150 | 1.0 | 30 | 10 | 1.7 | 0.18 |
| Comparison Example 21 | n-layer | 1/180 | 300 | 1.0 | 160 | 20 | 1.4 | 0.22 |
|  | p-layer | 1/250 | 150 | 1.0 | 160 | 10 | 1.1 | 0.33 |
| Comparison Example 22 | n-layer | 1/60 | 300 | 10.0 | 160 | 20 | 32 | 0.8 |
|  | p-layer | 1/60 | 150 | 10.0 | 160 | 10 | 36 | No crystal |

In the output characteristics, when incident light 209 of AM1.5 with 100 mW/cm² was directed to silicon thin film solar cells of Comparison Examples 20 to 22, open-circuit voltage Voc, short-circuit current density Jsc, fill factor F.F., and conversion efficiency Effi. are given in Table 15.

TABLE 15

|  | Voc (volts) | Jsc (mA/cm$^2$) | F.F. (%) | Effi. (%) |
|---|---|---|---|---|
| Comparison Example 20 | 0.475 | 25.9 | 71.2 | 8.7 |
| Comparison Example 21 | 0.451 | 26.0 | 67.0 | 7.8 |
| Comparison Example 22 | 0.371 | 23.0 | 51.7 | 4.41 |

The photoelectric conversion characteristics of Comparison Examples 20 to 22 given in Table 15 are clearly poorer than those of Embodiment 16 to 22, and particularly the photoelectric conversion efficiency is much lower. More specifically, in Comparison Example 20, the hydrogen dilution efficiency, reaction gas pressure, and discharge power are smaller than those of the embodiments, and therefore the deposition speed is significantly lower than the embodiments and the photoelectric conversion efficiency is low. In Comparison Example 21, the hydrogen dilution ratio is raised to similarly to Embodiment 17, but the reaction gas pressure is low similarly to the conventional methods and the discharge power is not sufficiently increased so that the deposition speed is significantly lower and the photoelectric conversion efficiency is low. In Comparison Example 22, while the reaction gas pressure and discharge power are higher than the conventional cases, but the hydrogen dilution ratio is small as the conventional case, which increases the deposition speed to a level equal to or higher than the embodiments, but the film quality of a resulting semiconductor layer is lowered, which significantly lowers the photoelectric conversion efficiency.

Embodiment 23

The methods of forming a polycrystalline silicon thin film solar cell including the steps of forming crystalline silicon layers 204, 205 and 206 at a low temperature and a high speed according to Embodiment 16 to 22 as described above are also useful in the manufacture of tandem type solar cells having an amorphous silicon-based thin film photoelectric conversion unit further layered upon, which is manufactured in substantially the same process. In Embodiment 23 corresponding to FIG. 2, an amorphous type photoelectric conversion unit 412 having an n-type layer 413, an i-type layer 414, and a p-type layer 415 is placed on polycrystalline silicon thin film photoelectric conversion unit 411. As i-type layer 414 included in amorphous type photoelectric conversion unit 412, a non-doped, amorphous silicon photoelectric conversion layer having a thickness of 0.3 μm was formed. In the tandem type solar cell according to Embodiment 23, the photoelectric conversion efficiency obtained under the same illumination conditions as the foregoing embodiments was 13.5%.

INDUSTRIAL APPLICABILITY

AS described above, by the methods of manufacturing a photoelectric converter according to the present invention, a crystalline silicon-based thin film layer can be significantly improved in the deposition speed as compared to conventional methods when the layer is formed by plasma CVD, higher film quality results, and the invention can greatly contribute to both improvement in the performance of silicon-based thin film photoelectric converters and reduction of the cost.

What is claimed is:

1. A method of manufacturing a silicon-based thin film photoelectric converter, said photoelectric converter comprising one or more photoelectric conversion units formed on a substrate, at least one of said photoelectric conversion units being a polycrystalline photoelectric conversion unit including a semiconductor layer of one conductivity type, a crystalline silicon-based thin film photoelectric conversion layer, and a semiconductor layer of the opposite conductivity type stacked in this order by plasma CVD, wherein said crystalline photoelectric conversion layer is deposited by said plasma CVD under the following conditions:

the temperature of the underlying layer is at most 550° C.;

a gas introduced into a plasma reaction chamber includes a silane-based gas and a hydrogen gas as main constituents, the flow ratio of the hydrogen gas relative to the silane-based gas being 50 times or more;

the pressure in said plasma reaction chamber is set to at least 3 Torr; and the forming speed of the film is at least 17 nm/min.

2. The method of manufacturing a silicon-based thin film photoelectric converter according to claim 1, wherein the pressure in said plasma reaction chamber is set to at least 5 Torr.

3. The method of manufacturing a silicon-based thin film photoelectric converter according to claim 1, wherein said photoelectric conversion layer is a polycrystalline silicon film or a microcrystalline silicon film having a crystallized volume fraction of at least 80%, contains hydrogen in the range from 0.5 atomic % to 30 atomic %, and has a thickness in the range from 0.5 to 20 μm.

4. The method of manufacturing a silicon-based thin film photoelectric converter according to claim 1, wherein said photoelectric conversion layer has a (110) preferential crystal orientation plane parallel to its film surface, and the intensity ratio of the (111) diffraction peak relative to the (220) diffraction peak in its X-ray diffraction is at most 1/10.

5. The method of manufacturing a silicon-based thin film photoelectric converter according to claim 1, wherein at least one of amorphous photoelectric conversion units including a semiconductor layer of one conductivity type, an amorphous silicon-based thin film photoelectric conversion layer, and a semiconductor layer of the opposite conductivity type sequentially layered upon one another by plasma CVD is added over or under at least one of said polycrystalline photoelectric conversion units.

6. The method of manufacturing a silicon-based thin film photoelectric converter according to claim 2, wherein a distance between an electrode which supports said substrate and an electrode opposite to the substrate is set to 1 cm or less in order to generate plasma discharge.

7. The method of manufacturing a silicon-based thin film photoelectric converter according to claim 6, wherein said photoelectric conversion layer is deposited in a plasma discharge power density of at least 100 mW/cm$^2$.

8. The method of manufacturing a silicon-based thin film photoelectric converter according to claim 6, wherein a high frequency power supply having a frequency of at most 150 MHz is used as a plasma discharge power supply when said photoelectric conversion layer is deposited.

9. A plasma CVD apparatus used in the method of manufacturing a silicon-based thin film photoelectric converter according to claim 6, wherein at least one of said two plasma discharge electrodes includes a movable electrode, and the distance between these two electrodes can be set to 1 cm or more when said substrate is transported and can be set to 1 cm or less when said photoelectric conversion layer is deposited.

10. The plasma CVD apparatus according to claim 9, wherein said electrode opposite to said substrate has said gas discharge inlets in a density of at least 2 inlets/cm$^2$ on its surface, and each of the gas inlets has a diameter in the range from 0.1 to 1 mm.

11. The plasma CVD apparatus according to claim 10, further comprising a gas flow path control plate which tubularly surrounds said two electrodes to control the flow rate of a gas discharged from said gas inlets, said gas flow path control plate being separated at a distance in the range from 1 to 50 cm from the circumference of said electrode.

12. The plasma CVD apparatus according to claim 11, wherein said gas flow path control plate extends in a direction substantially orthogonal to said two electrodes, and both ends of said plate extend beyond the positions of said two electrodes.

13. The plasma CVD apparatus according to claim 11, wherein said gas flow path control plate can be controlled at a temperature 100° C. plus and minus the temperature of said substrate.

14. A method of manufacturing a silicon-based thin film photoelectric converter by plasma CVD, wherein a layer of one conductivity type is formed to have a thickness in the range from 2 to 50 nm, an i-type crystalline silicon-based photoelectric conversion layer is formed to have a thickness in the range from 1 to 5 μm at a deposition speed of at least 17 nm/min, a layer of the opposite conductivity type is formed to have a thickness in the range from 2 to 50 nm, and said one conductivity type layer, said i-type photoelectric conversion layer and said opposite conductivity type layer are sequentially formed in the same plasma CVD reaction chamber.

15. The method of manufacturing a photoelectric converter according to claim 14, wherein at the time of depositing said crystalline silicon-based photoelectric conversion layer, a material gas includes a silane-based gas including at least one of silane and disilane and hydrogen, the flow ratio of the silane-based gas/hydrogen is in the range from 1/100 to 1/500.

16. A method of manufacturing a silicon-based thin film photoelectric converter, said photoelectric converter comprising one or more photoelectric conversion units formed on a substrate, at least one of these photoelectric conversion units being a polycrystalline photoelectric conversion unit including a semiconductor layer of one conductivity type, a crystalline silicon-based photoelectric conversion layer of substantially intrinsic semiconductor, and a semiconductor layer of the opposite conductivity type sequentially layered upon one another by plasma CVD, wherein at least one of these conductivity type layers includes a crystalline silicon-based thin film and the crystalline conductivity type layer is deposited by said plasma CVD under the following conditions:

the temperature of the underlying layer is at most 550° C.;

a silane-based gas and a diluted gas containing hydrogen are used as main constituents of a material gas introduced into a plasma reaction chamber, where the flow rate of the diluted gas is 100 times as large as that of the silane-based gas;

the pressure in said plasma reaction chamber is set to at least 5 Torr; and the film is deposited at a speed of at least 12 nm/min in the thickness-wise direction to have a thickness in the range from 2 to 50 nm.

17. The method of manufacturing a silicon-based thin film photoelectric converter according to claim 16, wherein said crystalline conductivity type layer is deposited at a pressure of at least 10 Torr in the said plasma reaction chamber and a deposition speed of at least 25 nm/min.

18. The method of manufacturing a silicon-based thin film photoelectric converter according to claim 16, wherein in the deposition conditions by said plasma CVD, said crystalline conductivity type layer becomes a crystalline silicon film having a crystallized volume fraction of at least 50%, when the crystalline conductivity type layer is deposited to have a thickness of at least 100 nm, said crystalline silicon film having hydrogen in the range from 0.5 to 30 atomic %, a (110) preferential crystal orientation plane parallel to its film surface, and the intensity ratio of the (111) diffraction peak relative to the (220) diffraction peak is at most 0.2.

19. The method of manufacturing a silicon-based thin film photoelectric converter, said photoelectric converter comprising one or more photoelectric conversion units formed on a substrate, at least one of these photoelectric conversion units being a polycrystalline photoelectric conversion unit including a semiconductor layer of one conductivity type, a photoelectric conversion layer of substantially intrinsic semiconductor, and a layer of the opposite conductivity sequentially layered upon one another by plasma CVD, wherein these semiconductor layers all include a crystalline silicon-based thin film, and are deposited by said plasma CVD under the following conditions:

the temperature of the underlying layer is at most 550° C.;

a silane-based and a diluted gas including hydrogen are used as main constituents of a material gas introduced into the plasma reaction chamber, the flow rate of the diluted gas being at least 100 times as large as that of the silane-based gas;

the pressure in said plasma reaction chamber is set to at least 5 Torr; and the film is deposited at a speed of at least 12 nm/min in the thickness-wise direction, any of the conductivity type layers being deposited to have a thickness in the range from 2 to 50 $\mu$m; and said photoelectric conversion layer being deposited to have a thickness in the range from 0.5 to 20 $\mu$m.

20. The method of manufacturing a silicon-based thin film photoelectric converter according to claim 16, wherein at least one of amorphous photoelectric conversion units including a semiconductor layer of one conductivity type, an amorphous silicon-based photoelectric conversion layer and a semiconductor layer of the opposite conductivity is added over or under at least one of said polycrystalline photoelectric conversion units.

* * * * *